United States Patent [19]

Mothersbaugh et al.

[11] Patent Number: 5,185,568
[45] Date of Patent: Feb. 9, 1993

[54] RF TEST LOAD AND METHOD FOR INTERNAL USE THEREOF

[75] Inventors: James M. Mothersbaugh, Akron; John E. Keim, Lodi, both of Ohio

[73] Assignee: Circle Prime Mfg. Co., Cuyahoga Falls, Ohio

[21] Appl. No.: 643,832

[22] Filed: Jan. 22, 1991

[51] Int. Cl.$^5$ .................. G01R 21/06; H01C 1/08; H03C 1/62
[52] U.S. Cl. .................... 324/95; 324/142; 338/51; 338/250; 455/115
[58] Field of Search .......... 324/95, 142, 156; 338/51, 230, 248, 250, 275; 455/67.7, 115

[56] References Cited

U.S. PATENT DOCUMENTS

| | | | |
|---|---|---|---|
| 2,457,597 | 12/1948 | Osterheld | 338/51 |
| 2,676,238 | 4/1954 | Coates | 338/51 |
| 2,702,334 | 2/1955 | Kleist | 338/51 |
| 2,946,005 | 7/1960 | Waterfield et al. | 324/95 |
| 3,345,561 | 10/1967 | Martin | 324/95 |
| 4,124,794 | 11/1978 | Eder | 338/51 |

Primary Examiner—Ernest F. Karlsen
Attorney, Agent, or Firm—Oldham, Oldham & Wilson Co.

[57] ABSTRACT

The invention describes an internal test load and method for forming an internal test load which is adapted to absorb energy from a power source such as an RF transmitter, transceiver, or amplifier. The test load is positioned internally within a housing, and includes at least one impedance device, such as a power resistor, coupled to the power source which is matched to the impedance thereof. The impedance device is supported on a heat sink which is adapted to absorb heat generated by the impedance device so as to be distributed over a relatively large area constituting the heat sink. The heat sink is positioned in spaced part relation to the housing, and is not directly supported or secured to the housing. A potting material surrounds the load assembly and supports the heat sink, wherein the heat sink effectively "floats" within the potting material such that heat absorbed by the heat sink will not be directly transferred to the housing, but will be dissipated through the potting compound. As an example, the internal test load is applied to an RF watt meter for testing low power RF transmitters, transceivers and RF amplifiers without an external load or antenna connected separately thereto. The test load may be mounted on a heat sink comprising an aluminum plate having a significant thickness. The potting material may be a strong, lightweight epoxy material, which may include a large number of air pockets therein, to facilitate dissipation of heat from the heat sink and to slow the transfer of heat to the housing in which the internal test load is positioned.

12 Claims, 2 Drawing Sheets

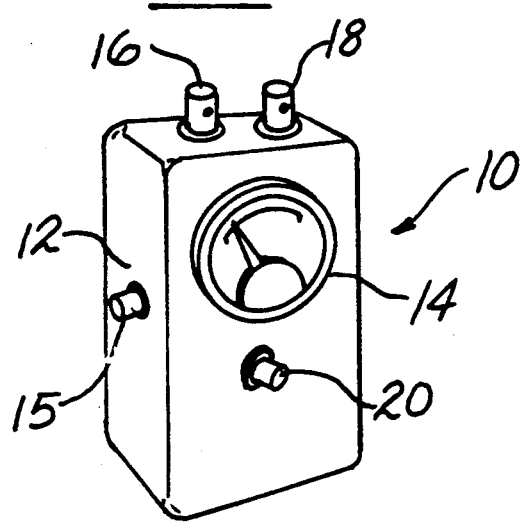
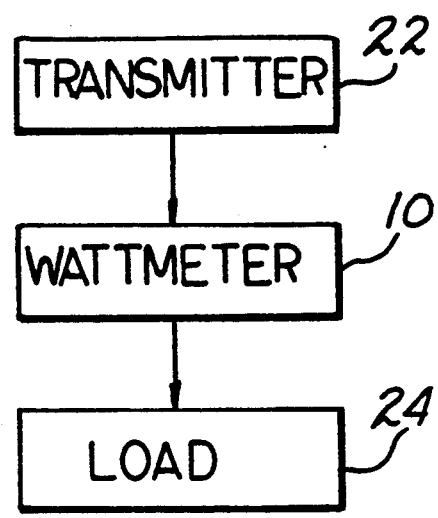
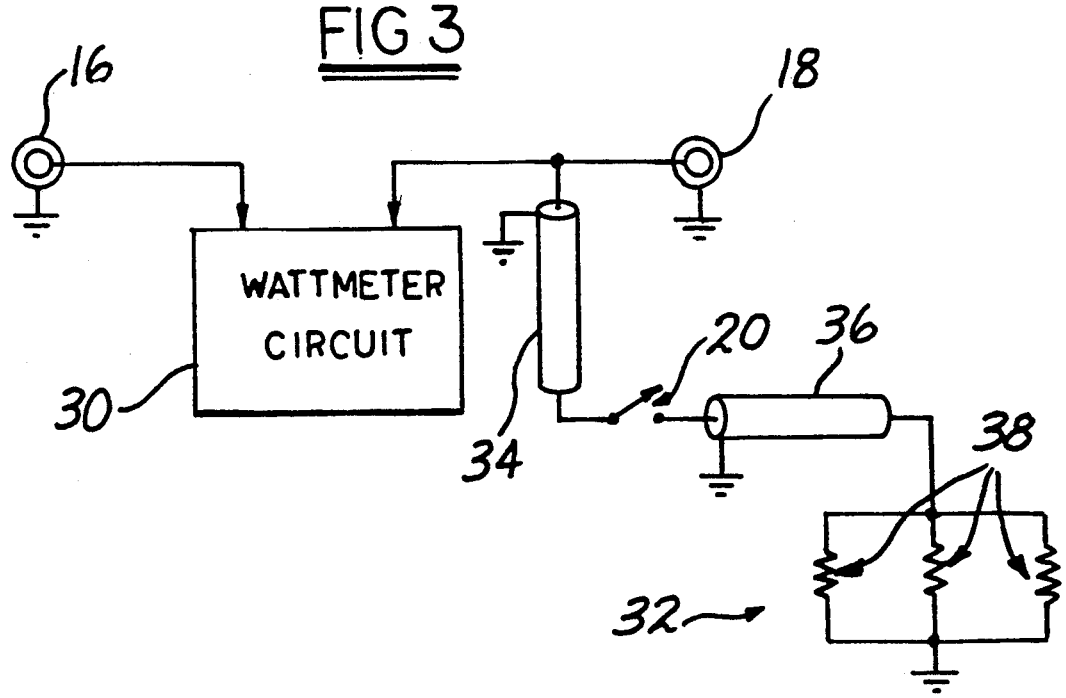

RF TEST LOAD AND METHOD FOR INTERNAL USE THEREOF

BACKGROUND OF THE INVENTION

The invention generally relates to a test load usable as an internal load for an indicating instrument such as a RF watt meter used for testing low power RF sources. More particularly, the invention relates to a low power RF test load and the method of application as an internal test load or dummy load which is adapted to absorb the RF energy applied thereto and effectively dissipate generated heat in an efficient manner.

In the use of the various RF transmitters, transceivers, amplifiers or other RF sources, the knowledge of the power output of the RF source will be necessary for proper coupling to an RF load such as an antenna. For example, a wattage measurement of the RF transmitter, transceiver or an RF amplifier may be required to give an indication of the incident RF energy applied to the RF load, to which the RF source is to be coupled. When testing an RF source for power output, the normal method entails coupling and operation of the RF source into a known load of proper impedance. The power into this load may be measured to provide the user with knowledge of the RF source characteristics. As an example, the RF load may ultimately be an antenna, but it may be desired to avoid unnecessary RF radiation and possible interference which can be accomplished by using a shielded resistive test load in the testing procedure. The test load is matched to the transmitter such that no power will be reflected back along the coupling RF transmission line and all power will be absorbed by the test load. In this manner, the test load enables a true representation of power to be measured by a suitable RF watt meter as an example.

For high powered devices, the test load would necessarily need to dissipate hundreds of watts, wherein the construction of the test load may become quite complex and expensive in its manufacture to achieve such dissipation. For smaller RF sources, such as smaller transmitters used in mobile telephones, hand-held and mobile two-way radios, or other smaller RF sources conventionally used in industry, the test load will also need to dissipate RF power, although significantly less power than with high powered devices. In high powered applications, the test load will normally be an external load wherein the heat may be properly dissipated without affecting or damaging the testing or measuring device. For lower RF power devices, such as 50 watts or less, the test load may be incorporated into the testing instrument itself as an internal load, although various precautions must be taken with such internal loads.

Using a watt meter as an example, various internal test loads have been developed in the prior art, which may be incorporated into the watt meter itself. The internal test load in the testing instrument allows the power of the RF source to be checked without using the RF load to which the source is to be coupled. For example, the power output of a transmitter may be determined without using the transmission system antenna. An antenna may not be properly matched to the transmitter, which would cause error in any power measurements and therefore is desired to be selectively removed from the system for testing purposes. An internal test load in a watt meter also allows testing to be accomplished without having to carry or connect any additional load or other piece of test equipment so as to make testing convenient. A watt meter with an internal test load may be used to initially perform a power test, after which the watt meter may be used in a normal fashion to read the forward and reflected power in an antenna system for tuning or matching thereof.

It should be apparent that even with low power devices, an internal test load adapted to absorb all power from the RF sources will quickly become very hot, and thus prior art test loads have usually resorted to various structures to absorb and transfer heat away from the load so as to be dissipated without damaging the testing equipment. The mounting structures for the internal test load found in the prior art have normally resorted to fin-type structures or plastic standoff arrangements which constituted specialized mounting hardware. Such structures are many times very large and heavy, thereby making the measuring device in which the test load is used cumbersome and unsuitable for many applications. Similarly, other prior art methods have resorted to extremely expensive methods of dissipating generated heat from the test loads such as special machined beryllium supporting structures or the like. In yet other known configurations, the test load may be supported by styrofoam mounting techniques which tend to insulate the internal electronics of the measuring device, but result in a structure which is not extremely durable and is susceptible to being damaged by excessive heat.

SUMMARY OF THE INVENTION

Based upon the foregoing, there has been found a need to provide an internal RF test load which more effectively dissipates generated heat upon the absorption of RF energy by the test load, and which is inexpensive and durable as well as being less cumbersome. It is therefore a main object of the invention to provide an internal RF test load having an improved means of dissipating generated heat without damaging the internal electronics or causing the housing of the test load to become hot over a short period of time.

It is another object of the invention to provide an internal test load which may be incorporated into an RF watt meter for testing low power transmitters, transceivers, or RF amplifiers without an external load or antenna connected separately.

It is another object of the invention to provide an internal test load and method of applying the internal test load such that generated heat is effectively dissipated while the construction of the internal test load is simplified and manufacture thereof is relatively inexpensive.

Yet another object of the invention is to provide an internal test load which may be incorporated into a portable hand-held indicating device usable in field situations, which will effectively dissipate heat generated in the load without causing the housing of the device to become too hot for handling thereof during testing therewith.

These and other objects of the invention are accomplished by an internal test load which is adapted to absorb energy from a power source such as an RF transmitter, transceiver, or amplifier. The test load is positioned internally within a housing, and includes at least one impedance device coupled to the power source which is matched to the impedance thereof. The impedance device is supported on a heat sink which is adapted to absorb heat generated by the impedance device so as to be distributed over a relatively large area constituting the heat sink. The heat sink is positioned in spaced part relation to the housing, and is not directly supported or secured to the housing. A potting material surrounds the load assembly and supports the heat sink, wherein the heat sink effectively "floats" within the potting material such that heat absorbed by the heat sink will not be directly transferred to the housing, but will be dissipated through the potting compound. In a preferred embodiment, the internal test load is applied to an RF watt meter for testing low power RF transmitters, transceivers and RF amplifiers without an external load or antenna connected separately thereto. The test load may comprise a plurality of power resistors which are mounted on a heat sink comprising an aluminum plate having a significant thickness. The potting material may be a strong, lightweight epoxy material, which may include a large number of air pockets therein, to facilitate dissipation of heat from the heat sink and to slow the transfer of heat to the housing in which the test load is positioned.

BRIEF DESCRIPTION OF THE DRAWINGS

These and other objects and advantages of the invention will become apparent upon a further reading of the detailed description of the invention in conjunction with the drawings, wherein:

FIG. 1 is a perspective view of a watt meter in which the internal test load of the invention is utilized;

FIG. 2 is a simplified block diagram of a testing procedure for performing a power test using the watt meter including the internal test load of the invention;

FIG. 3 is a simplified schematic circuit diagram of the watt meter of FIG. 1 including the internal test load of the invention;

DETAILED DESCRIPTION OF THE INVENTION

Figure 4:
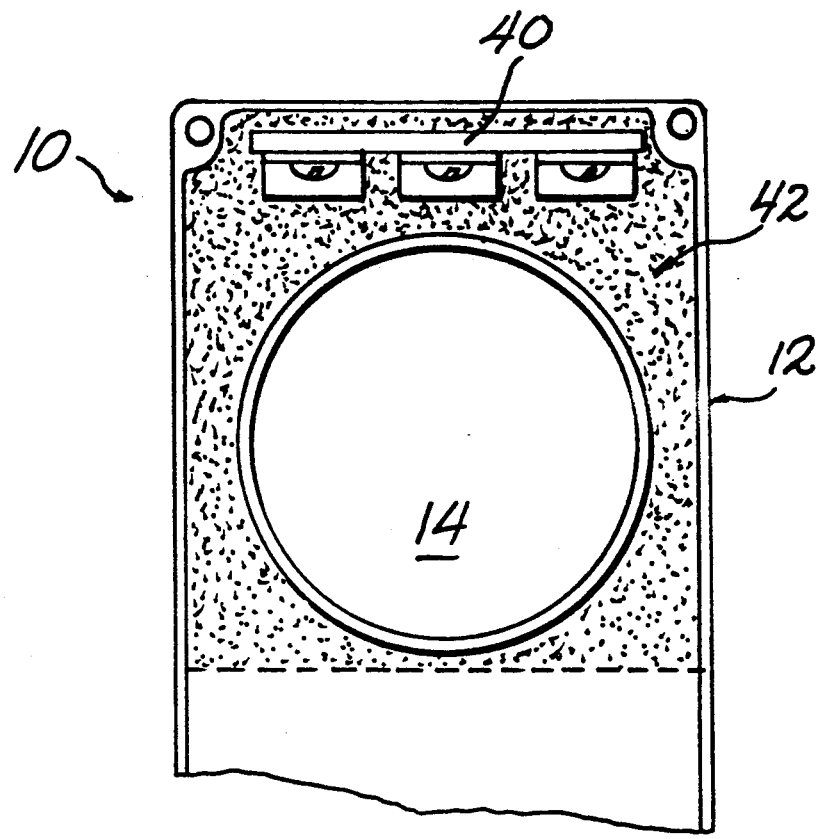
FIG. 4 is an enlarged partial elevational view of the watt meter of FIG. 1 having a panel of the outer casing removed and showing the mounting of the internal test load therein.

In the description of the invention, a portable hand-held watt meter is utilized to facilitate the description of the invention and to indicate the application thereof. In FIG. 1, the portable watt meter 10 comprises a small housing 12 providing a pocket size hand-held indicating instrument. The watt meter 10 includes a meter 14, and may be an insertion-type RF directional watt meter, normally used for measuring and indicating the forward and/or reflected carrier wave power in coaxial transmission lines of an RF transmission system. The watt meter 10 is adapted to be connected in or inserted in an RF transmission line by means of a coaxial transmission line section coupled to watt meter 10 through BNC connector 16. The watt meter 10 may also be coupled to an RF load such as an antenna by means of a second BNC connector 18, to enable use of the watt meter 10 in the normal fashion to read the forward and reflected power in an antenna system for tuning or matching purposes. An inductive pick-up coil formed in part of the watt meter circuitry may be responsive to the voltage wave signal on the transmission line, and is adapted to transmit a voltage signal to provide an indication of the level of either the forward voltage wave signal or the reflected voltage wave signal on meter 14, depending upon the setting of a forward/reflected voltage selector switch 15. The switch 15 selects the portion of the internal circuit designed to read forward or reflected voltage signal. The watt meter 10 includes an internal test load as will be described in more detail hereinafter, wherein a switch 20 may be provided to selectively couple the internal test load to the RF power source while removing the RF load or antenna from the circuit.

As seen in FIG. 2, when testing an RF power source such as a transmitter, transceiver or RF amplifier for power output, the transmitter 22 is operated to couple a signal into a known load 24 of proper impedance, wherein the power into this load may be measured by means of RF watt meter 10. Although the RF load to be ultimately coupled to the transmitter 22 will be an antenna, during a test of the transmitter power output, it is desirable to remove the antenna from the system to avoid the transmission of unnecessary RF radiation which possibly may cause interference or other problems. A test load 24 may therefore be coupled into the transmission circuit, which may comprise a shielded resistive load having an impedance which is matched to the transmitter 22. Normally, the transmitter will exhibit a characteristic impedance of 50 ohms, wherein the test load 24 will also be provided as a 50 ohm load so as to be matched with the transmitter. In this way, the power output of the transmitter 22 into load 24 will be accurately indicated by means of watt meter 10, as all power is absorbed by load 24 with no reflected power or standing waves generated in the transmission system. By providing watt meter 10 with a switch 20 adapted to selectively couple the internal test load 24 into the transmission system, the transmitter power may be tested without using an antenna. In this way, error which may arise from a mismatched antenna will be avoided and there will be no need to carry or connect any additional load or other piece of the test equipment to test the power output of the transmitter 22 or other RF source. After performing a power test using the internal load 24, the watt meter 10 may then be used in a normal fashion to read the forward and reflected power of the antenna system once the antenna is coupled into the system for tuning thereof.

Turning now to FIG. 3, the basic circuit components of the watt meter 10 including the internal test load comprise the BNC connector 16 for input of the RF source signal such as a transmitter signal. The RF source signal is input to the watt meter circuit 30 of the device. An output of the watt meter circuit 30 is coupled to the BNC connector 18 for an RF load such as an antenna, and is also selectively coupled to a test load generally indicated at 32 by means of a first length of coaxial cable 34 coupled to load switch 20 and a second length of coaxial cable 36. In the preferred embodiment, the internal test load 32 comprises three, 20 watt, non-inductive tab-mount power resistors 38 placed in parallel and each having an impedance such that the proper impedance to be matched with the RF source will be provided by the load 32. The power resistors 38 preferably have a very flat voltage standing wave ratio (VSWR) over a wide frequency bandwidth. As an example, the resistors 38 may have a VSWR of 1:1 or better over a frequency range of DC to 150 MHz. It may further be desirable to have a flat VSWR response over a broader frequency range for other commercial or industrial applications.

Figure 5:
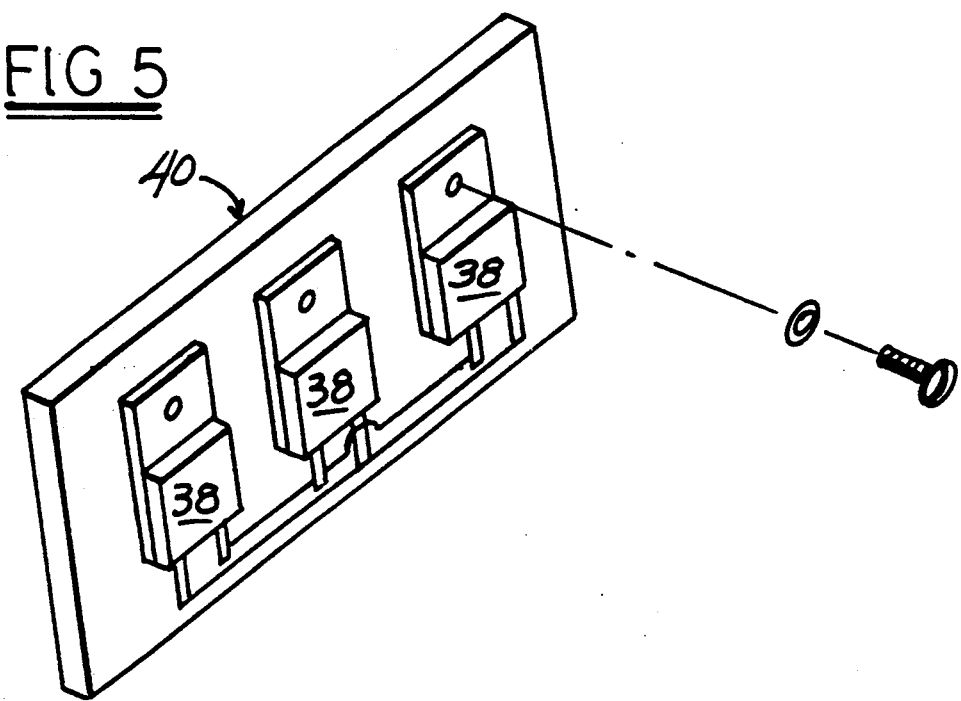
FIG. 5 is an enlarged perspective view of the test load as seen in FIG. 4.

Turning to FIGS. 4 and 5, the internal load of the invention is shown as positioned in watt meter 10 to provide the excellent heat dissipation characteristics and other advantages of the invention. The three non-inductive tab-mount power resistors 38 are shown to be mounted on a heat sink 40 comprising a metal plate, which in the preferred embodiment is a ⅛ inch or thicker aluminum plate, positioned within the watt meter case 12. As a unique aspect of the invention, the heat sink 40 is not directly mounted to the housing 12, and is instead positioned within a potting compound 42 which fills the housing 12 in the region indicated in FIG. 4. The heat sink 40 along with the impedance elements 38 forming the internal test load, are completely surrounded by the potting compound 42, and essentially "float" within the housing or case 12 of the watt meter 10. The heat sink 40 as well as the load resistors 38 are positioned in spaced apart relationship to the housing 12 on all sides thereof, such that no direct contact with the housing 12 is made by any portion of the internal test load of the device.

It has been found that due to the "float" mounting of the plate 40 along with the load resistors 38 thereon in the potting compound 42, that heat generated upon RF power being applied to the load resistors 38 is more efficiently and effectively dissipated and distributed from the test load. Upon initiation of a test for power output of an RF source, the load resistors 38 will immediately generate heat which will be initially transferred to the immediately surrounding potting compound 42 as well as the heat sink or aluminum plate 40. As the resistors 38 are in direct contact with the aluminum plate 40, much of the heat generated by load resistors 38 will be absorbed by the plate 40 over its entire area, wherein the thickness and dimensions of the plate will facilitate the distribution and dissipation of the heat over a larger area. By mounting the aluminum plate 40 within the potting compound 42, heat from the plate 40 will be evenly distributed to the surrounding potting compound to provide significantly improved heat dissipation in the device. In this way, the housing 12 of watt meter 10 will become heated at a much slower rate than achievable in the prior art, so as to allow the user to conduct testing over a longer period of time without the possibility of being forced to stop testing as a result of heating or being burned by heating of housing 12. It has additionally been found that by providing the potting compound 42 over the entire region as seen in FIG. 4, that the internal electronics of watt meter 10 will not be subject to damage from excessive heat generated from the internal test load. Thus, the watt meter 10 can be operated at the maximum rated load over a long period of time without breakdown or distortion of the measurements, thereby providing significant advantages.

In another aspect of the invention, it has been found that the potting compound 42 may be provided as an epoxy material which may be described as a micro-balloon epoxy which includes a large number of air pockets or tiny bubbles therein. The air pockets or bubbles which are formed throughout the potting compound 42 provide significant additional heat dissipation benefits. The large number of air pockets or bubbles result in the potting compound 42 which is less dense such that the heat from the aluminum plate 40 will be distributed slowly therethrough. This type of potting compound inhibits heat transfer and adds to the delay in conduction of heat from the load resistors 38 and heat sink 40 toward the housing 12 of the device.

It has been found that the mounting of the internal test load as described provides a very durable construction which is simplified and extremely inexpensive to manufacture. As an example of the advantageous heat dissipation characteristics of this arrangement, for a power source of 50 watts applied into the load resistors 38, the load may be under power for at least one minute, which gives more than ample time to make a power measurement. Tests have shown a temperature rise after one minute of only 22° C. above ambient room temperature for the watt meter case 12, while the internal electronics inside case 12 only showed a temperature rise of 10° C. above ambient after the one minute time period.

Although the invention has been described with reference to preferred embodiments thereof, it should be apparent that various changes or modifications may be resorted to without departing from the spirit of the invention. For example, the test load of the invention may be usable for dummy loads or other thermotransfer applications, wherein the improved heat dissipation characteristics would be advantageous. Accordingly, the invention is not to be limited in scope to the specific embodiments shown and described herein, but is only limited to the scope of the invention as defined in the appended claims.

What is claimed is:

1. An electronic instrument having associated therewith an internal test load adapted to absorb energy from a power source comprising:
   a housing for electronic circuit components of said instrument and for said test load,
   said test load comprising at least one impedance device coupled to said power source, and being matched to the impedance of said power source,
   a heat sink on which said at least one impedance device is supported which is adapted to absorb heat generated by said impedance device,
   a potting compound positioned within said housing which surrounds and supports said heat sink and said at least one impedance device, wherein said heat sink floats within said potting compound such that heat absorbed by said heat sink or generated by said at least one impedance device is not directly transferred to said housing and is dissipated through said potting compound.

2. The electronic instrument of claim 1, wherein said at least one impedance device comprises a non-inductive power resistor having a flat VSWR over a wide frequency bandwidth.

3. The electronic instrument of claim 2, wherein, a plurality of said power resistors are utilized as the test load, each of which has a pre-selected power rating and together define an impedance which is matched to the impedance of said power source.

4. The electronic instrument of claim 1, wherein said heat sink is a metal plate having a pre-selected thickness on which said at least one impedance device is directly mounted so as absorb heat generated by said at least one impedance device.

5. The electronic instrument of claim 4, wherein said metal plate comprises an aluminum plate having a thickness of ⅛ inch or greater.

6. The electronic instrument of claim 1, wherein said potting compound is a micro-balloon epoxy having a large number of air pockets formed therein, which acts to slow the transfer of heat conduction from said at least one impedance device or said heat sink to said housing.

7. A watt meter having an internal test load associated therewith for the testing of the power output of low power RF sources, comprising, a housing in which circuit components of said watt meter and an internal test load are positioned, and supporting a meter means for yielding an indication of the power output of low power RD sources, said test load comprising at least one impedance device coupled through said circuit components of said watt meter to a source of RF power, said at least one impedance device being matches to the impedance of said power source, said test load having associated therewith a heat sink on which said at least one impedance device is supported, and a potting compound positioned within said housing which surrounds and supports said heat sink and said at least one impedance device, wherein said heat sink floats within said potting compound such that heat absorbed by said heat sink or generated by said at least one impedance device is not directly transferred to said housing and is dissipated through said potting compound.

8. The watt meter of claim 7, wherein said at least one impedance device comprises a non-inductive power resistor having a flat VSWR over a wide frequency band width.

9. The watt meter of claim 8, wherein, a plurality of said power resistors are utilized as the test load, each of which has a pre-selected power rating and together define an impedance which is matched to the impedance of said power source.

10. The watt meter of claim 7, wherein said heat sink is a metal plate having a pre-selected thickness on which said at least one impedance device is directly mounted so as absorb heat generated by said at least one impedance device.

11. The watt meter of claim 10, wherein said metal plate comprises an aluminum plate having a thickness of ⅛ inch or greater.

12. The watt meter of claim 7, wherein said potting compound is a micro-balloon epoxy having a large number of air pockets formed therein, which acts to slow the transfer of heat conduction from said at least on impedance device or said heat sink to said housing.

* * * * *